(12) United States Patent
De Souza et al.

(10) Patent No.: US 6,708,308 B2
(45) Date of Patent: Mar. 16, 2004

(54) SOFT OUTPUT VITERBI ALGORITHM (SOVA) WITH ERROR FILTERS

(75) Inventors: Jorge Campello De Souza, San Jose, CA (US); Brian H. Marcus, Los Altos, CA (US); Richard M. H. New, San Jose, CA (US); Bruce A. Wilson, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 484 days.

(21) Appl. No.: 09/757,984

(22) Filed: Jan. 10, 2001

(65) Prior Publication Data

US 2002/0129318 A1 Sep. 12, 2002

(51) Int. Cl.[7] .................. H03M 13/03; H03M 13/00
(52) U.S. Cl. ............................. 714/795; 714/780
(58) Field of Search ................. 714/795, 780, 714/786; 365/341, 265, 262, 350

(56) References Cited

U.S. PATENT DOCUMENTS

| 5,327,439 A | 7/1994 | Estola et al. |
| 5,537,444 A | 7/1996 | Nill et al. |
| 5,621,764 A | 4/1997 | Ushirokawa et al. |
| 5,729,560 A | 3/1998 | Hagenauer et al. |
| 5,784,392 A | 7/1998 | Czaja et al. |
| 5,802,116 A | 9/1998 | Baker et al. |
| 5,867,531 A | 2/1999 | Shiino et al. |
| 5,949,831 A | 9/1999 | Coker et al. |
| 6,012,161 A * | 1/2000 | Ariyavisitakul et al. .... 714/795 |
| 6,302,576 B1 * | 10/2001 | Ono et al. ................... 714/794 |
| 6,396,878 B1 * | 5/2002 | Piirainen ..................... 375/262 |
| 2001/0022820 A1 * | 9/2001 | Zhengdi et al. ............. 375/265 |
| 2002/0122510 A1 * | 9/2002 | Yakhnich et al. ........... 375/342 |

OTHER PUBLICATIONS

Hagenauer, J. et al. "A Viterbi Algorithm with Soft–Decision Outputs and its Applications", German Aerospace Research Establishment, Institute for Communications Technology, IEEE, 1989, pp. 1680–1685.

Hagenauer, J. et al. "Iterative Decoding of Binary Block and Convolutional Codes", IEEE Transactions on Information Theory, vol. 42, No. 2, Mar. 1996, IEEE, pp. 429–445.

* cited by examiner

*Primary Examiner*—Phung M. Chung
*Assistant Examiner*—Joseph D. Torres
(74) *Attorney, Agent, or Firm*—Jon A. Gibbons; Fleit, Kain, Gibbons, Gutman, Bongini & Bianco P.L.

(57) ABSTRACT

This invention is a Viterbi algorithm combined with the use of error filters outputs to produce bit reliabilities. The present invention is a SOVA-like method using error filters to reduce the complexity of bit reliability determination further than that of the ordinary SOVA method. Error patterns corresponding to each of a handful of dominant i.e., most common error patterns are determined from experimental data. Error filters determine likelihoods of each postulated error pattern. These likelihoods are then combined to produce bit reliabilities that may be passed on to an outer error correction decoder. The filters, typically six or seven of them, resolve most of the errors thereby simplifying computation dramatically.

21 Claims, 4 Drawing Sheets

300

SOFT OUTPUT VITERBI ALGORITHM (SOVA) WITH ERROR FILTERS

PARTIAL WAIVER OF COPYRIGHT

All of the material in this patent application is subject to copyright protection under the copyright laws of the United States and of other countries. As of the first effective filing date of the present application, this material is protected as unpublished material. However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

CROSS-REFERENCE TO RELATED APPLICATIONS

Not Applicable

BACKGROUND OF THE INVENTION

1. Field of the Invention

The invention relates to a Soft Output Viterbi Algorithm. More particularly, the invention is a simplified method and apparatus for more easily computing and providing bit reliabilities in combination with a Viterbi algorithm on a processing unit.

2. The Prior Art

The Viterbi algorithm is used for detecting data possibly corrupted by noise in movement of data through communications or recording systems. The algorithm computes the most likely sequence written on the recording given the received noisy data. The output is consistent with some constraints on the sequences that are allowed to be written.

a. Ordinary SOVA

A channel trellis is a diagram defined by states and branches that describes the "ideal" sequence of outputs to a sequence of inputs. For instance, an Inter-Symbol Interference (ISI) channel trellis, determined by a linear channel impulse response such as Partial Response Class 4 (PR4), Extended Partial Response Class 4 (EPR4) or Extended$^2$ Partial Response Class 4 (E$^2$PR4) describes the ideal response of such a channel to any possible sequence of binary Non-Return to Zero (NRZ) inputs.

For simplicity, an assumption is made that the trellis is a possibly "pruned" version of a standard ISI channel trellis diagram with memory v. The states are binary v-tuples, and for u=0 or 1, there is a branch from state $(x_{-v} \ldots x_{-1})$ to $(x_{-v+1} \ldots x_{-1}u)$. Each branch has an input label (u) and output label (the ideal channel response to the input sequence $(x_{-v} \ldots x_{-1}u)$.

The "pruning" may be the consequence of a constraint (such as MTR) on the channel inputs designed to improve the performance of the detection process.

If the channel detector is designed to pass soft information to a code whose codewords are in some domain other than NRZ (e.g., NRZI, PR4), then the approach described here could be modified accordingly.

Naturally, an assumption is made that the ideal sequence of channel outputs is corrupted by a noise source. The Bahl, Cocke, Jelinek, Raviv (BCJR) algorithm, produces exact a posteriori probabilities (APP) for each bit, assuming that the noise is uncorrelated and data-independent (for instance, Additive White Gaussian Noise (AWGN)). These APP probabilities can be used as soft-decision inputs passed on to other modules in the detection/decoding process, such as a turbo decoder or low density parity check (LDPC) decoder.

Experimental results on test-stand data show that the BCJR algorithm, in conjunction with low density parity check codes, performs quite well—in spite of the fact that the test-stand noise is typically correlated and data-dependent. But the complexity of the BCJR algorithm may prove too costly for implementation.

SOVA (soft output Viterbi algorithm) is a method for producing approximate APP's at a lower computational cost than BCJR. The estimates produced by SOVA are based on Viterbi margins (i.e., differences between the metric of a survivor path and its non-surviving path in the Viterbi algorithm). SOVA was introduced by Hagenauer and Hoeher in "A Viterbi Algorithm with Soft Decision Outputs and its Applications", Proceedings of Globecom, 1989, pp. 1680–1686.

b. Description of Algorithm

SOVA begins with an ordinary run of the Viterbi algorithm on a long block (of length N) of data. The branch metrics are ordinarily determined by the received channel sample $r_j$ and the ideal channel output w on the branch: $\|r_j - w\|^2$; but prior information from previous LDPC iterations may be incorporated in the branch metrics (by adding a term of the form log p where p is the prior probability that the j-th data bit equals the branch input label).

At each bit position j, in between 1 and N, the Viterbi algorithm computes and outputs a detected data bit $x_j$. As is well known this requires a delay equal to the so-called path memory, denoted M (typically, N will be much larger than M). SOVA requires an additional delay, denoted $\Delta$, within which one makes use of Viterbi margins.

At bit position j, after a delay of $\Delta+M$, the Viterbi detector will have detected data bits in positions up to $j+\Delta$. For each $k=j+1, \ldots, j+\Delta$, the detected path up to position k will be a survivor path. As such, it will have at most one non-surviving (runner-up) path ending at the same state (it may have no such paths if the trellis has been pruned). Call this non-surviving path $p_k$, and let $m_k$ denote the Viterbi margin (i.e., the difference between the metric of the detected path up to time k and the metric of $P_k$) The algorithm is concerned only with those $p_k$ that would result in a different value for the j-th data bit, i.e.

$$(p_k)_j \neq x_j.$$

Such a k is called j-qualified. So, for bit position j, Viterbi margins are computed only for those k that are j-qualified. FIG. 1 illustrates a non-surviving path $p_k$ (100) for a j-qualified k as described in the prior art.

For the j-th bit position SOVA will output $$\omega_j = (-1)^{x_j} \min_k m_k$$

where the minimum runs over all j-qualified k such that $j+1 \leq k \leq j+\Delta$. As shown in J. Hagenauer and E. Offer and L. Papke, "Iterative Decoding of Binary Block and Convolutional Codes", IEEE Transactions on Information Theory, March, v.42, 1996, pp 429–445, this quantity is an approximation to the true APP log-likelihood:

$$\omega_j \approx \log\left(\frac{P(x_j|r^j)}{P(\overline{x}_j|r^j)}\right)$$

where $r^j$ denotes the received sequence of samples up to time $j+\Delta+M$ and $\overline{\chi}_j$, denotes the binary complement of $\chi_j$.

c. Access to the non-surviving path $p_k$

FIG. 2 illustrates a Soft Output Viterbi Algorithm Decoder (200) as described in the prior art. Signals are input into the decoder (200) from a channel (202). The signals pass through an equalizer (204) and into the primary decoding stages of the SOVA. The non-surviving path $p_k$ could be obtained from the Viterbi detector with a delay of time M. But then each state s and each $i=1, I \ldots, M$, would require an enormous buffer to store all the non-surviving paths ending at state s at time slot k-i.

An alternative would be to use a second Viterbi detector (212), V2, operating with delay M (210) with respect to the first Viterbi detector (206), V1. Then V1 (206) would provide the detected data path with delay M (210), and V2 (212) would provide the non-surviving path $p_k$. This is described as follows.

First, a buffer is needed, detected buffer (208) DB in FIG. 2, to store the last $\Delta$ detected bits: $x_{k-\Delta+1} \ldots x_k$. At time slot k+M, this buffer is updated by shifting one unit to the left and filling in the right-most position with the newly detected bit $x_k$ from V1 (206). If $\Delta \geq v$ (i.e., the look-ahead is at least as large as the channel trellis memory), then the ending state $s_k$ of the detected path can be read directly from DB (208) and fed to V2 (212). The differences between the Viterbi detectors V1 (206) and V2 (212) are:

1—V2 (212) has path memory $\Delta$ instead of M.

2—At time slot k+M, V2 (212) computes all survivor paths ending at bit position k instead of k+M.

In all other respects, V2 (212) operates exactly the same as V1 (206).

In the trellis, state $s_k$ has at most two incoming branches. The initial states of these branches are called s and s'. As usual, V2 (212) will add the branch metrics to the current state metrics of s and s' in order to determine the survivor path at state $s_k$. One of these will be the detected path, and the other will be the non-surviving path $p_k$. Of course, V2 (212) will have access to DB (208) and therefore to the identity of state $s_k$ as shown in FIG. 2.

Then V2 (212) will pass the margin $m_k$, at state $s_k$, as well as the last $\Delta$ bits of the non-surviving path, $(p_k)_j$, $j=k-\Delta+1$, ..., k, to the qualification/minimization (QM 214) module, which also requires access to the buffer DB (208) of detected bits and an accumulated minimum margin buffer (AMMB 216). At any given time instant k, this module finds the bit positions j for which k is j-qualified and iteratively computes the margins $m_k$, the minimum margin $\omega$ and ultimately the soft outputs.

c. Pseudo-Code for Computation of Soft-Output

Fork=1, ..., N,{ obtain detected bit $x_k$ from Viterbi detector;

$\mu_k=1000$;

```
For (j = Max(k-Δ,1); j<=k; j++) { //loop executed in parallel//
    If ((P_k)_j != x_j ) {
        μ_j = Min(μ_j,m_k);
    }
```

}
$j^* = k-\Delta +1$;
$\omega_{j^*} = (-1)^{x_{j^*}} \mu_{j^*}$.
} d. Complexity

The overhead required by SOVA, above and beyond that required by the Viterbi detector V1, comprises the following:

1—A second Viterbi detector V2 with path memory $\Delta$.

2—A detection buffer (DB) to hold the detected bits $x_{k-\Delta+1} \ldots x_k$.

3—$\Delta-1$ comparisons per bit in the qualification/minimization module.

4—An accumulated minimum margin buffer (AMMB) to hold the accumulated minimum margins $\mu_{k-\Delta+1} \ldots \mu_k$.

For a 64-state channel trellis, with $M=\Delta=64$, the number of additions and multiplications for SOVA will be double that of ordinary Viterbi detection and the number of comparisons with be triple that of Viterbi detection. Also, the additional buffers will make the storage requirements somewhat more than double that of Viterbi detection. In addition, SOVA will produce soft outputs with double the latency that the Viterbi algorithm produces hard decisions.

e. Other Prior Art

Further, other related prior art includes Hagenauer's paper, a patent application filed on Oct. 27, 1999, Attorney Docket No. CH19990112, "Method and Apparatus for Encoding and Detection/Decoding of MTR/Parity Codes", by Cideciyan et al., and U.S. Pat. No. 5,949,831, "Method and Apparatus for Data Detection for PRML Data Channels", by Coker et al., filed May 21, 1997, issued Sep. 7, 1999. These references use error filters to determine if the output reliability crosses some threshold or if parity is violated in a transmission or recording. Here, each filter corresponds to a most likely error which is corrected using an error correction scheme applied to a sequence of symbols or bits.

Also, H. Sawaguchi and S. Mita describe a method for decoding using concatenated error correction in "Soft-output decoding for concatenated error correction in high-order PRML channels," ICC, 1999, pp. 1632–1637.

Accordingly, what is needed is an improved system and method that is not as complex as a BCJR or the ordinary SOVA algorithm and yet accurately produces bit reliabilities. The present invention addresses such a need.

SUMMARY OF THE INVENTION

This invention is not a variation of a Viterbi Algorithm itself, rather, the invention is a Viterbi algorithm combined with the use of error filter outputs to produce bit reliabilities.

Thus, the present invention is a SOVA-like method using error filters to reduce the complexity of bit reliability determination further than that of the ordinary SOVA method.

Error patterns corresponding to each of a handful of dominant i.e., most common error patterns, are determined from experimental data. Error filters determine likelihoods of each postulated error pattern. The filters, typically six or seven of them, resolve most of the errors thereby simplifying computation dramatically. The filters do not do general error correction, rather, the error filters compute likelihoods of the most likely error-causing events and are combined to provide bit reliability estimates.

BRIEF DESCRIPTION OF THE FIGURES

The subject matter which is regarded as the invention is particularly pointed out and distinctly claimed in the claims at the conclusion of the specification. The foregoing and other features and advantages of the invention will be apparent from the following detailed description taken in conjunction with the accompanying drawings.

DETAILED DESCRIPTION OF THE PREFERRED EMBODIMENTS

Figure 1:
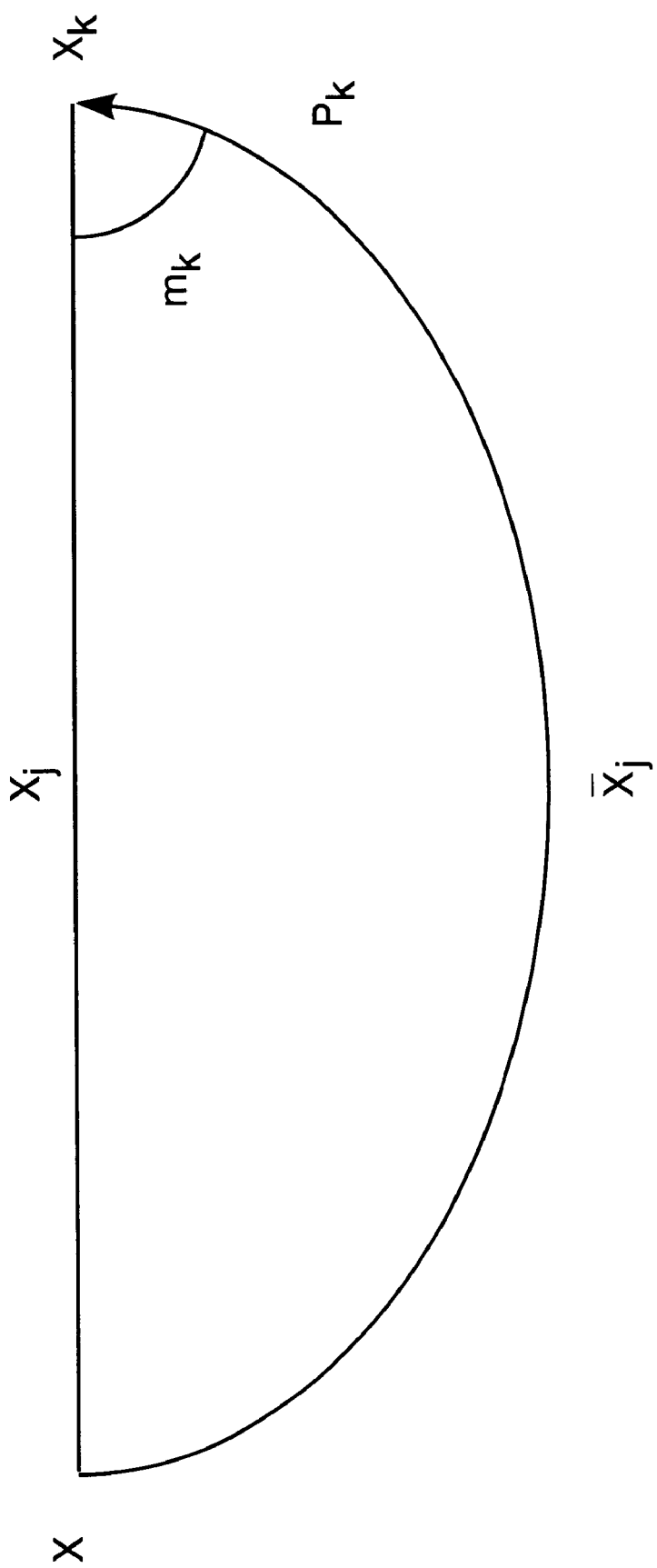
FIG. 1 illustrates a non-surviving path $p_k$ for a j-qualified k as described in the prior art.
Figure 2:
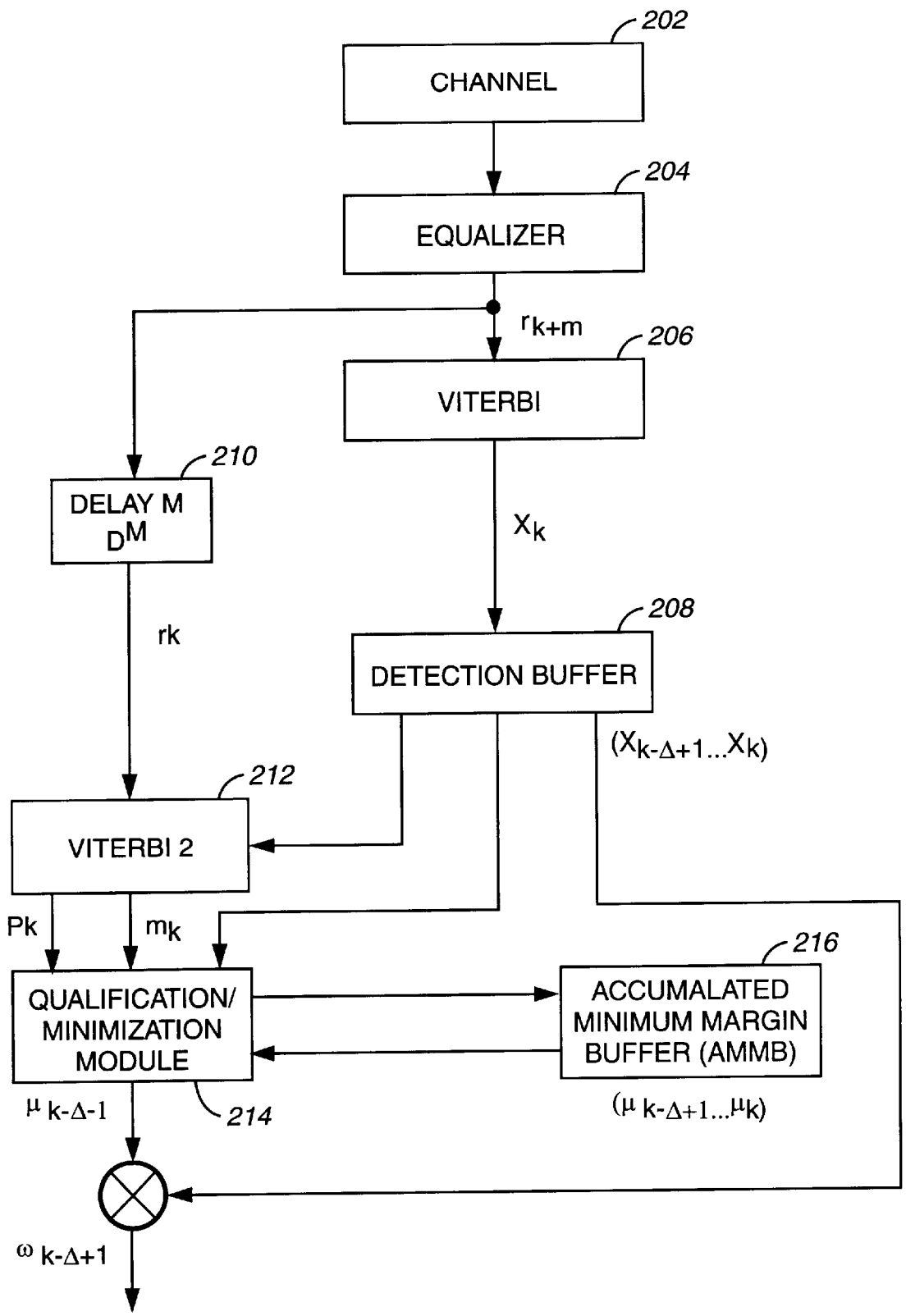
FIG. 2 illustrates a Soft Output Viterbi Algorithm Decoder as described in the prior art.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

1. Exemplary Embodiment a. Modified SOVA: SOVA with Error Filters

An error event is the difference between two sequences which differ in only finitely many places. If the sequences are binary (such as NRZ), then an error event can be considered to be a finite word over the alphabet $\{+1,0,-1\}$, often abbreviated as $\{+,0,-\}$. For a given channel impulse response, a finite set E of error events is fixed. These should be chosen to be the most likely error events for a given channel impulse response, such as $E=\{+,+-+\}$ for PR4.

Just as in ordinary SOVA, the ordinary Viterbi algorithm is applied to a block of data, possibly incorporating prior information from a previous LDPC iteration, with some specified path memory M. But instead of using the minimum Viterbi margin over a range of some size, the modified SOVA uses the minimum Viterbi margin with respect to only the error events in E. This sub-optimal scheme will generally have much lower complexity than ordinary SOVA.

Typically, an assumption is made that the block size N is substantially larger than the path memory M which in turn is substantially larger than the maximal length, L, of an error event in E.

b. Description of Algorithm

Let $h_0, h_1, \ldots, h_v$ denote the coefficients of the channel impulse response h so v+1 is the length of the response. For any k, at time k+M the Viterbi detector will have detected candidate symbols or data bits in positions up to k:

$$x = x_1 \ldots x_k.$$

Figure 3:
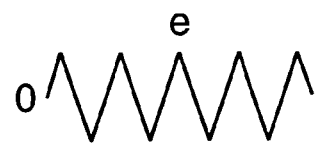
FIG. 3 illustrates an Error Event which is the difference between two sequences that differ in only finitely many places.
Figure 3:
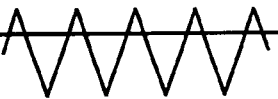
Figure 3:
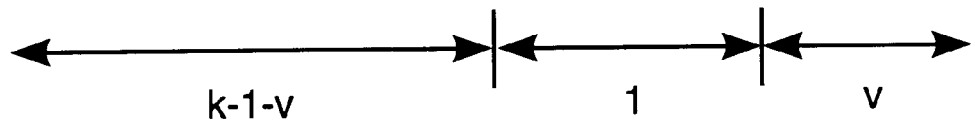
Figure 3:
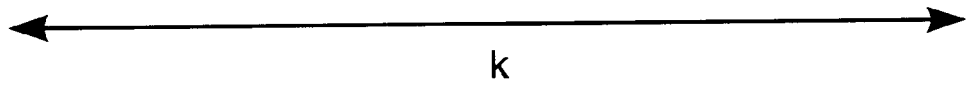

For any error event $e=e_1 \ldots e_l$ in E where $l=l(e)$ is the length of e, let y be the sequence obtained from x by e positioned so that it ends at bit position k-v as in FIG. 3. It is convenient to represent this translate of e as a sequence, $s_k(e)$, of length k:

$$s_k(e) = 0 \ldots 0 \, e_1 \ldots e_l \, 0 \ldots 0$$

where in this expression there are k-l-v 0's at the beginning and v 0's at the end. Then:

$$y = x + s_k(e).$$

Note that while the error event (in NRZ) ends at bit position k-v, the effect of the error event in the channel trellis does not end until bit position k (in order to flush out the channel memory).

Of course, in order for the error event to be plausible, y must be a binary sequence. For instance, one cannot simultaneously have $x_j=1$ and $(s_k(e))_j=+$. Also, the only error events that need to be considered are those that would have resulted in a different detected decision. So, given j, for the j-th bit position Viterbi margins are computed only over those pairs (k, e) that qualify under the following two conditions:

Q1: for $i=k-l-v+1, \ldots k-v$ if $(s_k(e))_j=+$, then $x_j=0$ and
if $(s_k(e))_j=-$, then $x_j=1$ Q2: $(s_k(e))_j \neq 0$ Such a pair (k,e) is called j-qualified.

Let $\hat{\chi}, \hat{y}$ denote the channel responses to the input sequences x,y:

$$\hat{\chi} = h * \chi \tag{1}$$

$$\hat{y} = h * y \tag{2}$$

where * denotes convolution. The channel error response to the error event e is then:

$$f = \hat{y} - \hat{\chi} = h * s_k(e) \tag{3}$$

Define the (k,e)-margin to be:

$$\begin{aligned} m_{k,e} &= \|r - \hat{y}\|^2 - \|r - \hat{x}\|^2 \\ &= \|(r - \hat{x}) - f\|^2 - \|r - \hat{x}\|^2 \\ &= -2\varepsilon \cdot f + \|f\|^2 \end{aligned} \tag{4}$$

where r denotes the sequence of received channel samples up to time k and $$\varepsilon = r - \hat{\chi}$$

the alleged error sequence.

The (k,e)-margin is computed as follows. The dot product in equation 4 above can be rewritten:

$$\begin{aligned} \varepsilon \cdot f &= \varepsilon \cdot (h * s_k(e)) \\ &= (\varepsilon * h^R) \cdot s_k(e) \end{aligned}$$

where $h^R$ is the filter matched to h, i.e., the time reversal of h.

Figure 4:
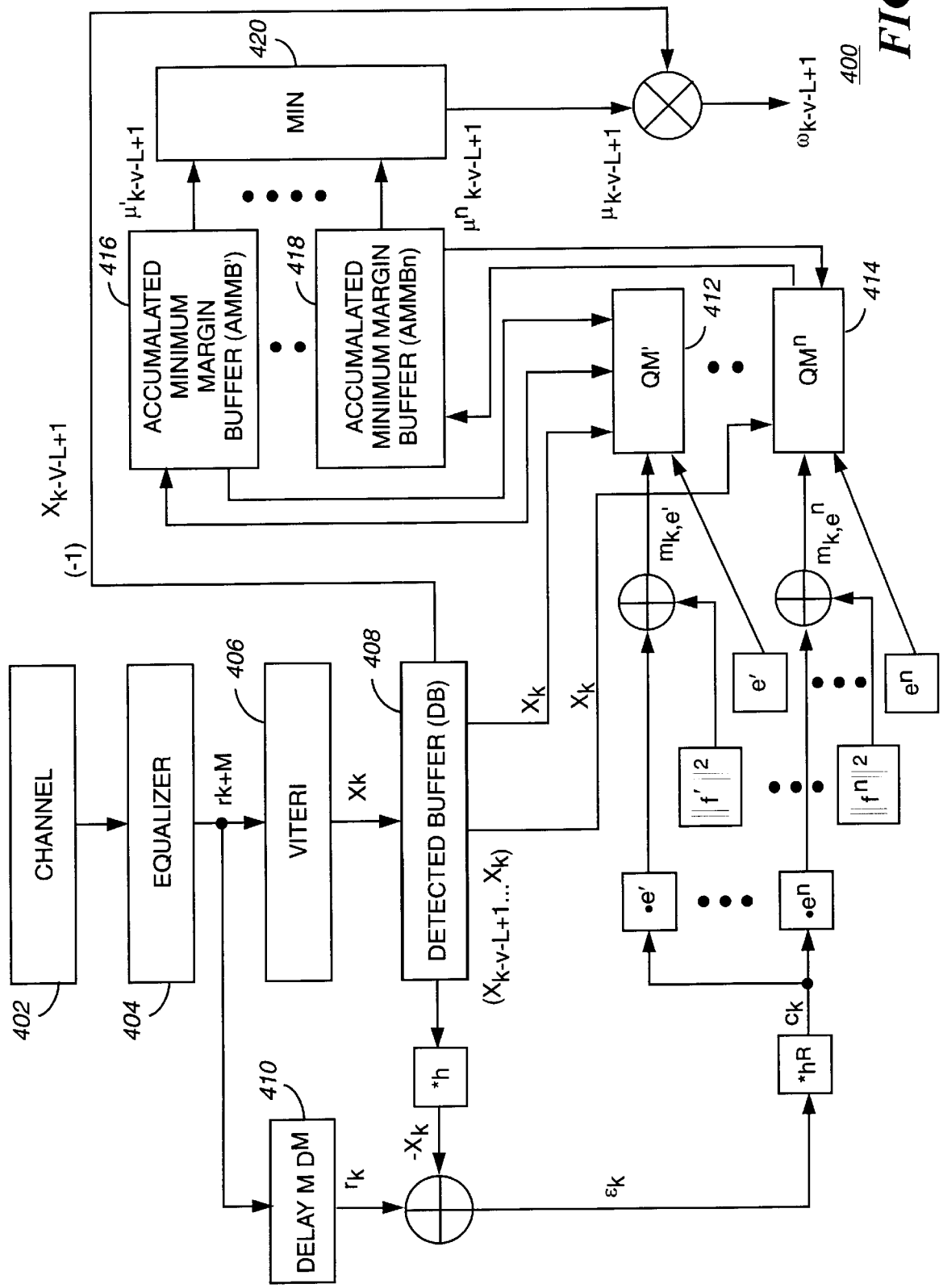
FIG. 4 illustrates a Modified Soft Output Viterbi Algorithm with Error Filters as practiced in this invention.

FIG. 4 illustrates a Modified Soft Output Viterbi Algorithm with Error Filters (400) as practiced in this invention. The Modified SOVA Decoder (400) comprises a channel (402) for reception of symbols, bits or numbers, an equalizer (404), a viterbi detector (406) a detected buffer (408) a delay M (410), accumulated minimum margin buffers (416, 418), qualification/minimization modules (412, 414) and a minimization function (420). To begin with, the alleged error sequence ε is convolved with $h^R$, a filter (*$h^R$) as shown in FIG. 4, and the result is passed through a bank of error filters with taps given by the error events e (see the filters (·$e^i$) in FIG. 4). The output of each error filter is then added to the term $\|f\|^2$ which is a constant energy term using a summation unit. Each such f depends on e and can be retrieved from a look-up table. The first convolution involves multiplications and additions, but the bank of error filters involves only additions since the entries of e are {+1, 0, −1}. Then, a qualification and combining process is performed on the margins $m_{k,e}$ in the QMs (412, 414). The specific operational conduct of the qualification and combining process is found below. The combining process is a process utilizing a combining unit, in this example a QM, so that the combining process is a minimization process. Next, the $m_{k,e}$ that are j-qualified are buffered in the AMMBs (416, 418). Finally, a minimization function is performed by the minimizer (420). The minimizer (420) computes a minimization over all $m_{k,e}$ that are j-qualified and produces $\mu_{k-\nu-L+1}$, which is multiplied by a sign value $(-1)^{x_{k-\nu-L+1}}$ to produce a soft output $\omega_j$.

The soft output is defined as:

$$\omega_j = (-1)^{x_j} \min_{(k,e)} m_{k,e}$$

where the minimum ranges over all j-qualified pairs (k,e). Alternatively, instead of generating a final soft output reliability using a minimization function, an averaging function can be used instead in the combining unit. Returning to the analysis of the soft output, $\omega_j$ gives an approximation to the log-likelihood:

$$\log\left(\frac{P(r|x_j)}{P(r|\bar{x}_j)}\right),$$

which agrees with the APP log-likelihood:

$$\log\left(\frac{P(x_j|r)}{P(\bar{x}_j|r)}\right)$$

provided that 0's and 1's are equally likely. Otherwise, the computation of $m_{k,e}$ is adjusted using prior information $p(x_j=1)$: namely, by adding to $m_{k,e}$ the following quantity:

$$\sum_{i=k-l-\nu+1}^{k-\nu} \nu_i$$

where $\nu_j=0$ if $(s_k(e))_j=0$ $\nu_j=\log(p(x_j=1)/p(x_j=0))$ if $(s_k(e))_j=+$ $\nu_j=\log(p(x_j=0)/p(x_j=1))$ if $(s_k(e))_j=-$ The pseudo-code in the next section describes the operations of the filters and the qualification/minimization QM' (412, 414) modules in FIG. 4. The qualification/minimization modules represent a plurality of modules though only two are shown in FIG. 4. Likewise, there are a plurality of AMMB' present although only two are shown in FIG. 4.

Within a QM module, the error event is tested for plausibility, i.e., condition Q1 above, and then the set of j=k−I(e) −ν+1, . . . , k−ν for which (k,e) is j-qualified (condition Q2 above) is determined. (If the error event is not plausible, then the set of such j is empty.) For each such j, the margin is updated by comparison with $m_{k,e}$. The QM' modules (412, 414) require access to an accumulated minimum margin buffer AMMB' (416, 418) and a detected buffer (420). For each error event, e, the corresponding QM module computes the minimum of $m_{k,e}$ over all j-qualified (k,e). These are then passed on to the minimization function (420) which computes on overall minimum over all error patterns, e. Alternatively, the minimization operation in the QM modules as well as the minimization function (420) can be replaced by averaging operations.

c. Pseudo-Code for Computation of Soft-output

For (k=1; k<=N; k++), {
    obtain detected bit $x_k$ from Viterbi detector;
    obtain alleged error $\epsilon_k$;
    obtain $c_k = (\epsilon * h^R)_k$; //convolve alleged error with $h^R$//
    $\mu_k = 1000$;
    For (i=1; i<=n; i++) {//for each error event e in E; executed in parallel//

```
        e = e^i;
        μ_k^i = 1000;
        l = Length(e);
        temp = 2c* e)_k //error filter//
        retrieve ||f||^2 from look-up table;
        m_{k,e} = −temp + ||f||^2;
            For (t= Max(k−l−v+1,1); t≤ k−v; t++) {
                If (x_t + (s_k(e))_t is not binary), terminate;
            }
            For (j=k−l−v+1; j ≤ k−v; j++) {//executed in parallel//
                If ( e_j ≠ 0 ) {
                    μ_j^i = Min(μ_j^i, m_{k,e});
                }
            }
        j* = k−L−v+1;
        μ_j* = Min(μ_j*, μ_j^i);
        }
        ω_j* = (−1)^{xj*} μ_j*
}
``` d. Complexity

Convolution of the alleged error ε with the matched filter $h^R$ requires ν+1 multiplications and ν additions per bit while recalling that ν+1 is the length of the channel impulse response. The error filter corresponding to error event e involves I(e) −1 additions and no multiplications per bit. Thus, the total overhead required by a Modified SOVA above that required by the Viterbi detector is:

$\nu + \Sigma_{e \in E}$ (I(e) −1) additions per bit;
    ν+1 multiplications per bit;
    $\Sigma_{e \in E}$ I(e) comparisons per bit;
    a detected buffer (DB 408) to store the last L+ν detected bits;
    n accumulated minimum margin buffers ($AMMB^1$, . . . , $AMMB^n$ 416, 418) where n is the number of error events in E;
    look-up tables to hold the contents of $\|f\|^2$ for each error event e.

Modified SOVA also requires a latency of L+ν beyond the Viterbi detector latency.

Assuming a 64-state channel trellis (so ν=6), M=64, and 5 error events of average length 4 and maximal length L=6, the extra overhead required by modified SOVA would be:

6+15=21 additions per bit;
    7 multiplications per bit;
    20 comparisons per bit;

a buffer to store the last 12 detected bits;

5 buffers each containing at most 6 analog entries and;

a look-up table containing 5 analog entries.

Thus, the buffer and look-up table overhead are insignificant and the number of additions, multiplications and comparisons per bit increase by (roughly) 15%, 5% and 30% respectively. Also, the latency would increase marginally from 64 to 76.

Note that the multiplications required here are all required by the Viterbi algorithm anyway. So, in principle these extra multiplications could be eliminated but this would come at the price of an additional huge buffer.

2. Conclusion

Therefore, a more efficient method, apparatus and product has been described that is not as complex as a BCJR or the ordinary SOVA algorithms and yet accurately represents bit reliabilities. Such a method is needed in order to produce bit reliabilities, in a simple and efficient manner, to be passed on to an outer error-correction decoder.

3. Discussion of Hardware and Software Implementation Options

The present invention, as would be known to one of ordinary skill in the art could be produced in hardware or software, or in a combination of hardware and software. The system, or method, according to the inventive principles as disclosed in connection with the preferred embodiment, may be produced in a single computer system having separate elements or means for performing the individual functions or steps described or claimed or one or more elements or means combining the performance of any of the functions or steps disclosed or claimed, or may be arranged in a distributed computer system, interconnected by any suitable means as would be known by one of ordinary skill in art.

According to the inventive principles as disclosed in connection with the preferred embodiment, the invention and the inventive principles are not limited to any particular kind of computer system but may be used with any general purpose computer, as would be known to one of ordinary skill in the art, arranged to perform the functions described and the method steps described. The operations of such a computer, as described above, may be according to a computer program contained on a medium for use in the operation or control of the computer, as would be known to one of ordinary skill in the art. The computer medium which may be used to hold or contain the computer program product, may be a fixture of the computer such as an embedded memory or may be on a transportable medium such as a disk, as would be known to one of ordinary skill in the art.

The invention is not limited to any particular computer program or logic or language, or instruction but may be practiced with any such suitable program, logic or language, or instructions as would be known to one of ordinary skill in the art. Without limiting the principles of the disclosed invention any such computing system can include, inter alia, at least a computer readable medium allowing a computer to read data, instructions, messages or message packets, and other computer readable information from the computer readable medium. The computer readable medium may include non-volatile memory, such as ROM, Flash memory, floppy disk, Disk drive memory, CD-ROM, and other permanent storage. Additionally, a computer readable medium may include, for example, volatile storage such as RAM, buffers, cache memory, and network circuits.

Furthermore, the computer readable medium may include computer readable information in a transitory state medium such as a network link and/or a network interface, including a wired network or a wireless network, that allow a computer to read such computer readable information.

What is claimed is:

1. A method for generating bit reliabilities by means of a simplified Soft Output Viterbi Algorithm (SOVA), the method on a processing unit for fault-tolerant communication comprising the steps of:

determining, in a SOVA decoder, a sequence of numbers r communicated over a channel, having a channel impulse response h with coefficients $h_0, h_1, \ldots, h_v$, wherein v+1 is a length of the response;

detecting by means of a Viterbi detector candidate symbols $x = x_1 \ldots x_k$ from the received sequence of numbers r, where k is a given length; and generating symbol reliability estimates for each symbol position in r and for each detected candidate symbol x using error filters including the sub-steps of:

convolving an error sequence $\epsilon$ with $h^R$, a time reversal of h; and processing the convolution $(\epsilon * h^R)$ with a bank of error filters with taps for each error filter in the bank of error filters determined by error events e, the output of each error filter given by:

$$(\epsilon * h^R) \cdot S_k(e)$$

where $S_k(e)$ is a sequence with the length k representing a translate of e.

2. The method as defined in claim 1, wherein the error filters are used to provide reliability estimates relative to error events for predetermined common error patterns that are most likely causes of errors.

3. The method as defined in claim 1, further comprising the step of:

computing (k,e) margins $m_{k,e}$ by summing a constant energy term with the output of at least one error filter wherein the output is multiplied by a constant factor of −2 before being summed with the constant energy term.

4. The method as defined in claim 3, further comprising the step of:

testing error events for plausibility in a plurality of qualification modules wherein only plausible error events that are binary sequences resulting in a different detected decision are considered for bit reliability determination i.e., for the j-th bit position Viterbi margins are computed only over those pair k and e that qualify under the following two conditions:

$Q1$: for $i = k-l-v+1, \ldots k-v$ if $(s_k(e))_i = +$, then $x_i = 0$ and
if $(s_k(e))_i = -$, then $x_i = 1$ $Q2$: $(s_k(e))_j \neq 0$.

5. The method as defined in claim 4, further comprising the steps of:

buffering $m_{k,e}$ that are j-qualified; and combining such $m_{k,e}$ to produce a reliability for the jth bit position.

6. The method as defined in claim 5, wherein the combining step is a minimization followed by multiplication by an appropriate sign.

7. The method as defined in claim 5, wherein the combining step is an averaging followed by multiplication by an appropriate sign.

8. A computer readable medium comprising instructions for generating bit reliabilities by means of a simplified Soft Output Viterbi Algorithm (SOVA), the instructions for fault-tolerant communication to and from a processing unit comprising the instructions of:

determining, in a SOVA decoder, a sequence of numbers r over a channel, having a channel impulse response h with coefficients $h_0, h_1, \ldots, h_v$, wherein v+1 is a length of the response;

detecting by means of a Viterbi detector candidate symbols $x=x_1 \ldots x_k$ from the received sequence of numbers r, where k is a given length; and generating symbol reliability estimates for each symbol position in r and for each detected candidate symbol x using error filters including:

convolving an error sequence $\epsilon$ with $h^R$, a time reversal of h; and processing the convolution ($\epsilon*h^R$) with a bank of error filters with taps for each error filter in the bank of error filters determined by error events e, the output of each error filter given by:

$$(\epsilon*h^R) \cdot s_k(e)$$

where $s_k(e)$ is a sequence with the length k representing a translate of e.

9. The computer readable medium as defined in claim 8, wherein the error filters are used to provide reliability estimates relative to error events for predetermined common error patterns that are most likely causes of errors.

10. The computer readable medium as defined in claim 9, further comprising the instruction of:

computing (k,e) margins $m_{k,e}$ by summing a constant energy term with the output of at least one error filter wherein output is multiplied by a constant factor of −2 before being summed with the constant energy term.

11. The computer readable medium as defined in claim 10, further comprising the instruction of:

testing error events for plausibility in a plurality of qualification modules wherein only plausible error events that are binary sequences resulting in a different detected decision are considered for bit reliability determination i.e., for the j-th bit position Viterbi margins are computed only over those pair of k and e that qualify under the following two conditions:

Q1: for $i=k-l-v+1, \ldots, k-v$ if $(s_k(e))_i=+$, then $x_i=0$ and
if $(s_k(e))_i=-$, then $x_i=1$ Q2: $(s_k(e))_j \neq 0$.

12. The computer readable medium as defined in claim 11, further comprising the instructions of:

buffering $m_{k,e}$ that are j-qualified; and combining such $m_{k,e}$ to produce a reliability for the jth bit position.

13. The computer readable medium as defined in claim 12, wherein the combining instruction is a minimization followed by multiplication by an appropriate sign.

14. The computer readable medium as defined in claim 12, wherein the combining instruction is an averaging followed by multiplication by an appropriate sign.

15. A system for generating bit reliabilities by means of a simplified Soft Output Viterbi Algorithm (SOVA), the system for fault-tolerant communication to and from a processing unit comprising:

SOVA decoder for determining a sequence of numbers r communicated over a channel, having a channel impulse response h with coefficients $h_0, h_1, \ldots, h_v$, wherein v+1 is a length of the response;

a viterbi detector for detecting candidate symbols $x=x_1 \ldots x_k$ from the received sequence of numbers r, where k is a given length; and a qualification and minimization module for generating symbol reliability estimates for each symbol position in r and for each detected candidate symbol x using error filters including:

a filter for convolving an error sequence $\epsilon$ with $h_R$, a time reversal of h; and a bank of error filters with taps determined by error events e, for receiving and processing the convolution ($\epsilon*h^R$) there through;

wherein the processing the convolution through the error filter is given by $$(\epsilon*h^R) \cdot s_k(e)$$

where $S_k(e)$ is a sequence with the length k representing a translate of e.

16. The system as defined in claim 15, wherein the error filters are used to provide reliability estimates relative to error events for predetermined common error patterns that are most likely causes of errors.

17. The system as defined in claim 15, further comprising:

a summation unit for computing (k,e) margins $m_{k,e}$ by summing a constant energy term with the output of at least one error filter wherein the output is multiplied by a constant factor of −2 before being summed with the constant energy term.

18. The system as defined in claim 17, further comprising:

a plurality of qualification modules for testing error events for plausibility wherein only plausible error events that are binary sequences resulting in a different detected decision are considered for bit reliability determination i.e., for the j-th bit position Viterbi margins are computed only over those pair k and e that qualify under the following two conditions:

Q1: for $l=k-l-v+1, \ldots, k-v$ if $(s_k(e))_i=+$, then $x_i=0$ and
if $(s_k(e))_i=-$, then $x_i=1$ Q2: $(s_k(e))_j \neq 0$.

19. The system as defined in claim 18, further comprising:

accumulated minimum margin buffers for buffering $m_{k,e}$ that are j-qualified; and a combining unit for combining such $m_{k,e}$ to produce a reliability for the jth bit position.

20. The system as defined in claim 19, wherein the combining unit comprises a combining unit that performs a minimization followed by multiplication by art appropriate sign.

21. The system as defined in claim 19, wherein the combining operation comprises a combining unit that performs an averaging followed by multiplication by an appropriate sign.

* * * * *